FABRICATION OF EXEMPLARY
RC CIRCUIT UTILIZING 3-LAYERED FILMS

INVENTORS
FRANCIS L. MURRAY, JR.
THOMAS V. SIKINA
BY
Robert D. Sanborn
ATTORNEY

ALTERNATIVE FABRICATION OF EXEMPLARY RC CIRCUIT USING 4 LAYERED FILMS

INVENTORS
FRANCIS L. MURRAY JR.
THOMAS V. SIKINA
BY
Robert D. Sanborn
ATTORNEY

SCHEMATIC DIAGRAM OF EXEMPLARY
RC CIRCUIT OF FIG. 1 AND FIG. 2.

FREQUENCY v. "Q" CHARACTERISTIC FOR
THIN FILM CAPACITORS

INVENTORS
FRANCIS L. MURRAY, JR.
THOMAS V. SIKINA
BY
Robert D. Sanborn
ATTORNEY

United States Patent Office 3,256,588
Patented June 21, 1966

3,256,588
METHOD OF FABRICATING THIN FILM R-C CIRCUITS ON SINGLE SUBSTRATE

Thomas V. Sikina, Willow Grove, and Francis L. Murray, Jr., Philadelphia, Pa., assignors to Philco Corporation, Philadelphia, Pa., a corporation of Delaware

Filed Oct. 23, 1962, Ser. No. 232,539
6 Claims. (Cl. 29—155.5)

Contemporaneous activity in the field of microminiaturization of electronic components and circuitry has precipitated numerous advances and accomplishments worthy of note. This invention relates to one of the same, viz., the construction, via a simple and economical process, of a microminiature array of close tolerance resistors and high-Q capacitors on a single substrate, using multiple layers of thin films.

Previous resistor-capacitor (RC) thin film circuitry was constructed by anodizing, on a common substrate, a single metallic film at various voltages—one voltage for capacitors and one or more different voltages for resistors. Disadvantages of this monometal approach, discussed in copending application of John G. Simmons, Serial No. 122,526, filed July 7, 1961, now abandoned and assigned to the present assignee, include:

(1) a circuit plate composed of microcircuits having resistors made from the same material as capacitors must be fabricated so that each circuit is anodized and monitored separately to control resistor tolerances, (2) the monometal capacitors have relatively poor frequency v. Q characteristics.

(3) a costly and complex fabrication process requiring interruption of vacua is required, and (4) relative difficulty of bonding external connections to the circuits is found.

Utilization of the process of the present invention obviates the aforementioned disadvantages of the monometal scheme. With the present process the resistance values for an entire circuit plate of 50 or 60 microcircuits can be controlled to ±7% of a given resistance on the initial deposition, which is reduced to ±5% after heat treatment. The circuit capacitors have Q's of 50 to 100 at 3 mc. In addition, the process is highly compatible since the basic circuit can be constructed without breaking vacuum. Leads are easily attached since gold conducting areas are provided.

*Objects*

The objects of the present invention thus include:

(1) the provision of a novel and economical microminiature thin film circuit fabrication process, (2) the provision of improved R-C circuits using thin film techniques, (3) the provision of multiple R-C circuits having close tolerances and high Q's in a compatible, economical fashion. Other objects and advantages of the invention will become apparent from a consideration of the following summary and description thereof.

*Summary*

In accordance with the preferred embodiment of the present invention thin film R-C circuits are formed on a substrate using an initial assembly of three sequentially deposited metallic films. Photolithographic techniques are used to pattern resistor areas from the first film, contact conductor areas and capacitor electrodes from the second film, and capacitor areas from the third film. The metallic capacitor areas are made dielectric by anodization, and counter electrode contacts are evaporated thereover. Almost any give R-C circuit can be reproduced in thin film form using the above techniques.

*Drawings*

Figure 1:
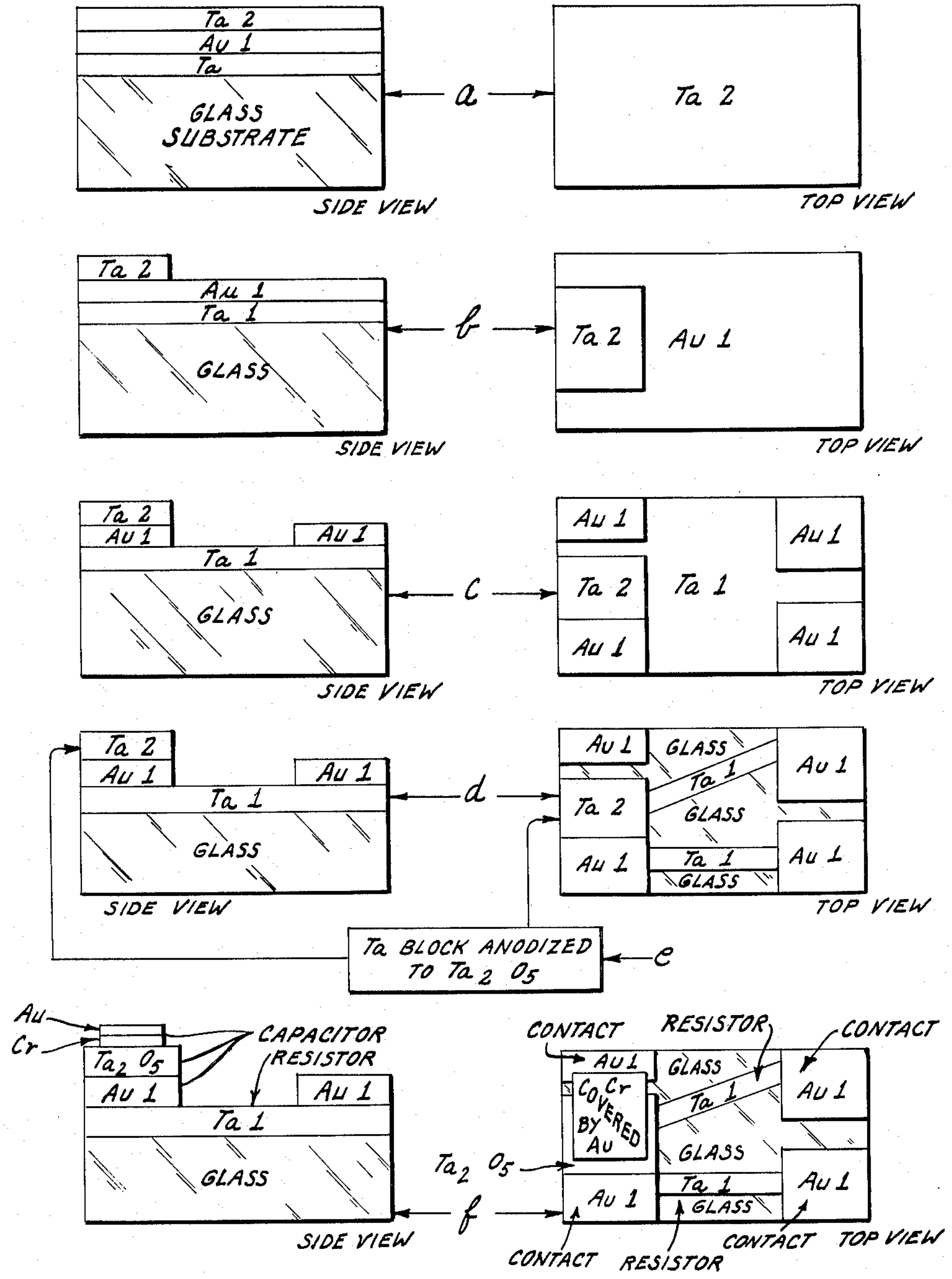
FIG. 1 depicts various stages in the fabrication of an exemplary R-C thin film circuit according to the preferred embodiment of the invention.

*FIG. 1.—Preferred embodiment*

Figure 3:
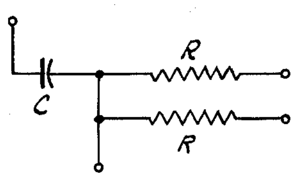
FIG. 3 shows a schematic diagram of the R-C circuit of FIGS. 1 and 2.

Fabrication of the exemplary R-C circuit shown in FIG. 3 is begun, according to the preferred embodiment of the invention, with the structure shown in FIG. 1A. A glass substrate is covered by a first layer of tantalum (Ta 1) an intermediate layer of gold (Au 1), and a second layer of tantalum (Ta 2). This initial structure may be formed without breaking vacuum in a sequential sputtering process, to be discussed infra. Using photolithographic techniques, most of the top layer of tantalum in the structure of FIG. 1A is etched away to leave the section thereof shown in FIG. 1B, which section will ultimately form the capacitor dielectric. Next the intermediate gold layer is selectively etched away to leave the four areas shown in FIG. 1C, which form the contacts for the circuit plate. The bottom layer of tantalum is now etched away to leave the two resistor strips shown in FIG. 1D. Next the block of Ta 2 is anodized (the rest of the circuit being masked) to grow an oxide ($Ta_2O_5$) thereon. This oxide will form the capacitor dielectric. Then external leads (not shown) are ultrasonically welded to the gold contact areas. Finally a counter electrode of chromium covered with gold is evaporated over most of the tantalum pentoxide dielectric as shown. This counter electrode also forms a bridge to the upper left gold contact area as shown to yield the R-C circuit of FIG. 3. The external leads may alternatively be attached after the counter electrodes are evaporated if it is found that the leads interfere with the formation of the counter electrode.

Figure 2:
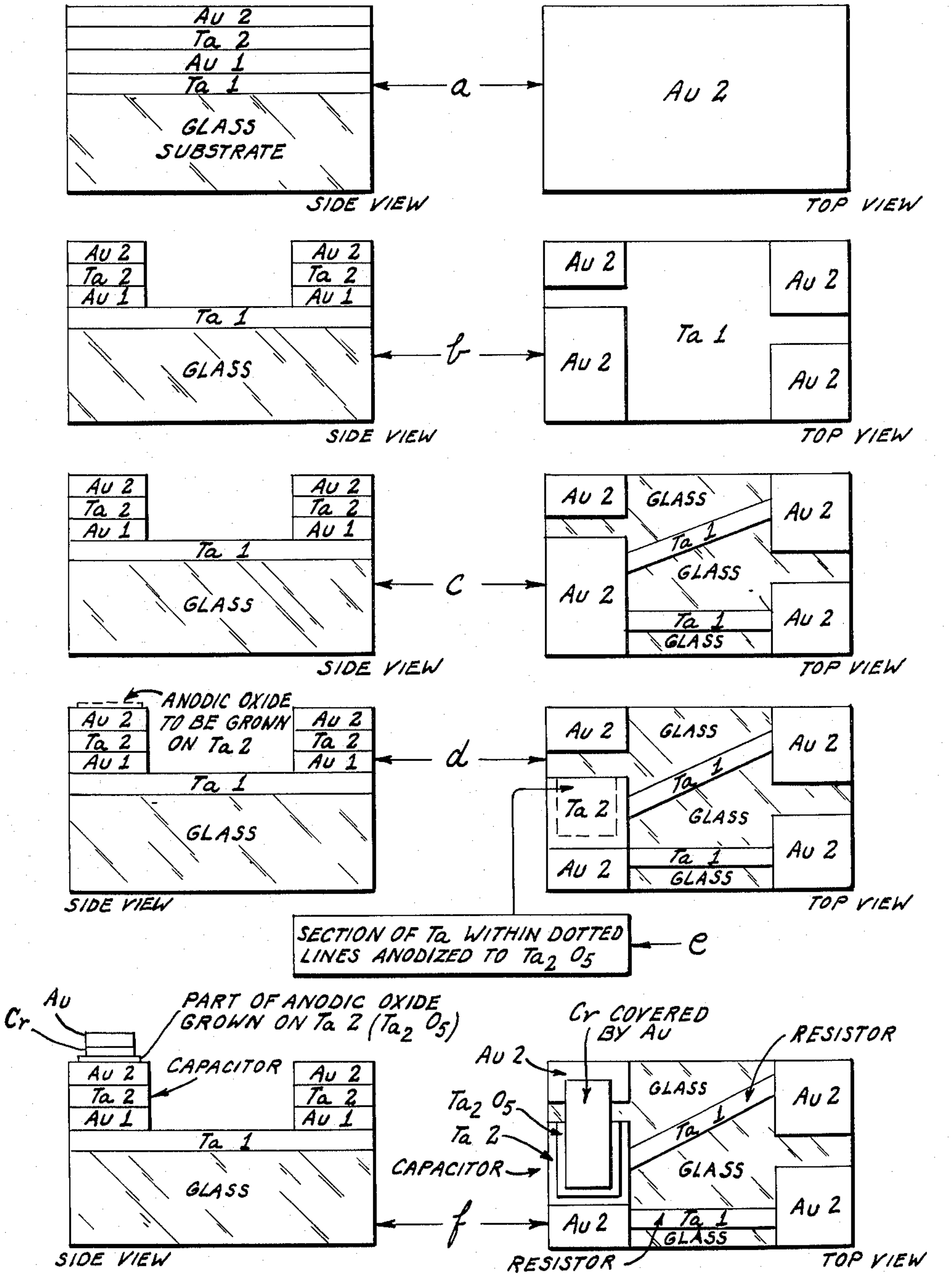
FIG. 2 depicts an alternative mode of fabrication of the exemplary R-C circuit of FIG. 1.

*FIG. 2—Alternative mode of fabrication*

The exemplary R-C circuit of FIG. 3 may be fabricated in an alternative manner by using the initial structure shown in FIG. 2A. Said structure may be formed in the same manner as the circuit of FIG. 1A, except that a second layer of gold, Au 2, is sputtered on top of Ta 2. The top three layers, Au 2, Ta 2, and Au 1 are then selectively etched away to leave the four contact areas shown in FIG. 2B. Next the bottom layer of tantalum is etched to form the resistor strips shown in FIG. 2C. Part of the lower lefthand patch of Au 2 is next removed to expose a section of Ta 2 as shown. In step C the part of this Ta 2 within the dotted lines is anodized (rest of the circuit being masked) to grow an oxide of $Ta_2O_5$ thereon which will form the capacitor dielectric. This oxide may grow to a level above the Au 2 film as shown in the side views of FIGS. 2D and 2F. Finally a counter electrode of Cr covered by Au is evaporated over most of the $Ta_2O_5$ dielectric as shown. As before the counter electrode also forms a bridge to the upper left gold contact area to yield the R-C circuit of FIG. 3.

*Details of fabrication*

It should be noted parenthetically that the vertical dimensions of the films in the diagrams of FIGS. 1 and 2 are extremely exaggerated. In actuality the thickness and length of the glass substrate may range approximately from 10 to 100 mils and 200 to 1,000 mils, respectively.

The multi-layer starting assemblies of FIGS. 1 and 2 may be formed by the sputtering process, in which a single vacuum system having Au and Ta cathodes and a rotating substrate holder will permit the deposition of alternate layers of different metals without breaking vacuum. Further details of this sequential sputtering process are discussed in the aforementioned Simmons application. Other processes, such as vacuum evaporation, may also be used to form the starting assemblies. Further details of the sputtering and vacuum evaporation processes per se may be gleaned by reference to Patent No. 2,993,266, granted to R. W. Berry on July 25, 1961.

The first layer deposited on the glass substrate (Ta 1) is made sufficiently thin (e.g. 375 A.) to provide a film of high resistivity so that it will be suitable for small area resistors.

The second layer (Au) is made relatively thick (e.g., 2000 A.) to provide low resistance conductor paths and good bonding areas for external connections and active elements. This layer also serves as a low resistivity base electrode for the anodized Ta dielectric, thus resulting in assembly capacitors having high-Q's.

The third layer deposited (Ta 2) is sufficiently thick (e.g., 2500 A.) to permit standard electrochemical anodizing to obtain a thick layer of $Ta_2O_5$ which serves as the dielectric for the capacitors.

The capacitor counter electrodes may be desirably evaporated over the anodized tantalum through metal masks, and may be composed of a layer of chromium followed by a layer of gold. However, the counter electrodes may alternatively be made from gold alone, aluminum alone, or any other suitable metal as is well known to those skilled in the art.

It has been observed that the counter electrode, which also forms a connection to the upper lefthand Au contact, does not form a bridge to the Au 1 film (below Ta 2) to short out the capacitor. It is theorized, but not assumed, that this is due either to: (1) the edges of both Ta layers (Ta 1 and Ta 2) may grow a projecting oxide during anodization to keep the evaporated counter electrode from reaching the Au 1 film, or (2) the counter electrode may not completely fill the gap during evaporation so that the walls and Au 1 are not contacted, or (3) during anodization any potentially deleterious gold may be removed when adjacent Ta atoms become oxidized.

In practice 50 or 60 different microcircuits of the type disclosed herein may be simultaneously produced on a single large circuit plate. Resistance values can be controlled to ±7% of a given ohms/square on the initial deposition, which can be reduced to ±5% after heat treatment. The values of individual resistors can also be adjusted to a closer tolerance when required. Details concerning the adjustment technique for precision resistor fabrication which is applicable to the instant invention are disclosed in the copending application of Mauro J. Walker, Serial No. 214,382, filed August 2, 1962, and assigned to the present assignee.

*FIG. 4*

Figure 4:
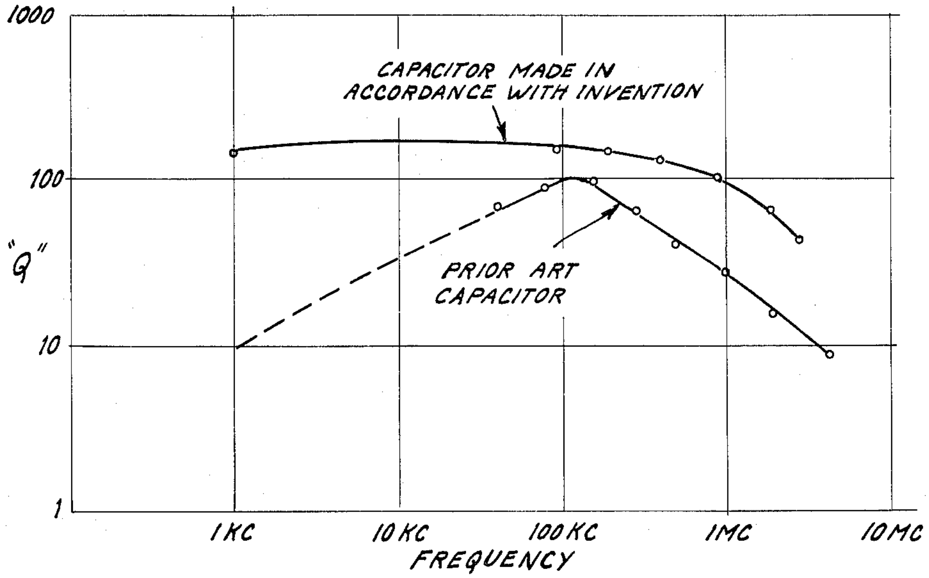
FIG. 4 shows curves relevant to the invention.

The Q v. frequency characteristics of the capacitors of the present invention are superior to those produced according to the process of the aforementioned Simmons application because of the low series resistance provided by the underlying gold. E.g., Q's of 50 to 100 have been obtained at 3 mc. with capacitors made according to the invention. FIG. 4 shows a representative comparison with the Q v. frequency characteristic of a prior art capacitor made by anodizing tantalum on a substrate and evaporating a counter electrode thereover.

Circuits made in accordance with the present invention are also susceptible of interconnection with transistor elements according to the technique set forth in the copending application of Thomas V. Sikina and John A. Hall, Jr., Serial No. 229,329, filed October 9, 1962, and also assigned to the assignee of the present invention.

The process of the invention has been specifically described above utilizing tantalum and gold as the circuit metals. Tantalum is preferred because it can be deposited in stable films of high sheet resistivity, has a low thermal coefficient of resistivity, is corrosion resistant, and is an excellent valve-metal and hence can be anodized to form good capacitors. Gold is preferred because of its low sheet resistivity and excellent corrosion resistance. However other metals can be used in lieu of these two metals. E.g., tungsten, titanium, chromium, molybdenum, and Nichrome may be used in place of tantalum; in place of gold, may be used platinum, rhodium, palladium, iridium, silver, nickel, aluminum and copper.

The specific R-C circuit of FIG. 3 whose fabrication was discussed herein is exemplary only. Almost any given R-C circuit configuration can be produced according to the invention, and hence the circuit shown is nowise to be considered limiting or indicative of the scope of the invention. The same applies to other specificities of the disclosure. Accordingly, the invention is defined only by the language of the appended claims.

We claim:

1. A process for fabricating a thin film resistance-capacitance circuit, comprising the following steps:
(a) forming on an insulating substrate a first film of a metal having a relatively high sheet resistivity,
(b) forming on said first film a second film of a metal having a relatively low sheet resistivity,
(c) forming on said second film a third film of a metal which is surface oxidizable to form an insulating layer,
(d) removing a portion of said third film to expose a portion of said second film and leave a remaining portion of said third film, whereby at least a part of said remaining portion is oxidizable to serve as a capacitor dielectric,
(e) removing part of said exposed portion of said second film to expose a portion of said first film and leave a remaining portion of said second film, said remaining portion of said second film being arranged to serve as at least one capacitor electrode,
(f) removing part of said exposed portion of said first film to form at least one resistor of the remaining portion of said first film,
(g) oxidizing said part of said remaining portion of said third film, thereby to form a dielectric area, and
(h) placing a metallic capacitor counter electrode having a relatively low sheet resistivity over at least a portion of the oxidized part of said third film.

2. The process of claim 1 wherein said third film is formed of the same material as said first film, and said oxidation of said third film is performed anodically.

3. The process of claim 1 wherein said first and third films are composed of metals selected from the group consisting of tantalum, tungsten, titanium, chromium, molybdenum, and Nichrome, and said second film is composed of a metal selected from the group consisting of gold, platinum, rhodium, palladium, iridium, silver, nickel, aluminum and copper.

4. The process of claim 1 wherein said first and third films are tantalum and said second film is gold.

5. A process for fabricating a thin film circuit having resistance and capacitance comprising the following steps:
(a) forming on an insulating substrate a first film of a metal having a relatively high sheet resistivity,
(b) forming on said first film a second film of a metal having a relatively low sheet resistivity,
(c) forming on said second film a third film of a substance which is surface oxidizable to form an insulating layer,
(d) forming on said third film a fourth film of a metal having a relatively low sheet resistivity
(e) removing like portions of said second, third, and fourth films to expose a portion of said first film and leave remaining portions of said second, third, and fourth films suitable for forming capacitor dielectric and contact areas, (f) removing part of said exposed portion of said first film to form at least one resistor of the remaining portion of said first film, (g) removing a part of the remaining portion of said fourth film to expose a part of the remaining portion of said third film, (h) oxidizing an area of the exposed portion of said third film to form a capacitor dielectric thereat, and (i) placing a metallic capacitor counter-electrode having a relatively low sheet resistivity over a portion of the oxidized area of said third film.

6. A process for preparing microminiature, thin film, resistance capacitance circuits, comprising the following steps:

(a) sputtering a tantalum first film onto a glass substrate, (b) sputtering a gold second film onto said first film, (c) sputtering a tantalum third film onto said second film, (d) photolithographically etching away a portion of said third film to leave remaining at least one area thereof for formation of a capacitor dielectric, and also to expose a portion of said second film, (e) photolithographically etching away a portion of said second film to leave remaining an area thereof at least partially underneath said remaining area of said third film, thereby to form a bottom capacitor electrode, and at least one other area thereof to form a resistor contact, (f) photolithographically etching away at least a portion of the exposed area of said first film to expose a portion of said substrate and leave at least one remaining resistive strip of said first film, said resistive strip having widened contact areas at spaced locations thereon, said contact areas lying under portions of said second film, (g) anodically oxidizing said area of said third film, thereby to form an insulating layer to serve as a capacitor dielectric, and (h) evaporating a conductive film over the oxidized area of said third film to form an upper electrode of said capacitor.

References Cited by the Examiner

UNITED STATES PATENTS

| | | | |
|---|---|---|---|
| 2,828,454 | 3/1958 | Khouri | 333—70 |
| 2,885,524 | 5/1959 | Eisler | 29—155.5 |
| 2,925,646 | 2/1960 | Walsh | 29—155.5 |
| 2,934,814 | 5/1960 | Williams et al. | 29—155.5 |
| 3,061,911 | 11/1962 | Baker | 29—155.7 |
| 3,179,854 | 4/1965 | Luedicke et al. | 317—101 |
| 3,183,407 | 5/1965 | Yasuda et al. | 317—101 |

OTHER REFERENCES

Aviation Week (Klass), Sept. 28, 1959, pp. 73, 75, 77, 79, 80, 83, 84, 87.

Electronic Engineering (Tucker et al.) October 1955, vol. 27, No. 332, pp. 451–453.

JOHN F. CAMPBELL, *Primary Examiner.*

WHITMORE A. WILTZ, *Examiner.*

P. M. COHEN, *Assistant Examiner.*